United States Patent [19]
Schreuders

[11] Patent Number: 6,031,432
[45] Date of Patent: Feb. 29, 2000

[54] BALANCING APPARATUS FOR SIGNAL TRANSMISSIONS

[76] Inventor: Ronald C. Schreuders, 21 Onondaga St., P.O. Box 514, Tully, N.Y. 13159

[21] Appl. No.: 09/032,517

[22] Filed: Feb. 27, 1998

Related U.S. Application Data

[60] Provisional application No. 60/038,541, Feb. 28, 1997.

[51] Int. Cl.[7] .................................................. H03H 7/01
[52] U.S. Cl. ................... 333/24 R; 333/28 R; 333/81 R; 333/167
[58] Field of Search ............................ 333/4, 24, 28 R, 333/81 R, 167–170, 172

[56] References Cited

U.S. PATENT DOCUMENTS

| | | | |
|---|---|---|---|
| Re. 34,720 | 9/1994 | Zelenz | 380/7 |
| 1,432,965 | 10/1922 | Casper | 333/28 R |
| 1,743,691 | 1/1930 | Shea . | |
| 1,772,506 | 8/1930 | Affel | 333/168 |
| 2,227,590 | 1/1941 | Landon | 333/167 |

(List continued on next page.)

FOREIGN PATENT DOCUMENTS

| | | |
|---|---|---|
| 50-39018 | 4/1975 | Japan . |
| 50-93534 | 7/1975 | Japan . |
| 51-54306 | 5/1976 | Japan . |
| 52-24025 | 2/1977 | Japan . |
| 53-27125 | 8/1978 | Japan . |

(List continued on next page.)

OTHER PUBLICATIONS

F. Scowen, *Electric Wave Filters,* Chapman & Hall, Ltd., London, 1950, Title Page & p. 178 Cited, QC 661S36.

M.E. Van Valkenburg, *Network Analysis,* Prentice–Hall, N.J., Title Page & p. 230 Cited.

Robert J. Wenzel: *Wideband High–Selectivity Diplexers Utilizing Digital Elliptic Filters*—EEE Transactions on Microwave Theory and Techniques, vol. MTT–15, No. 12, Dec. 1967.

General Instrument—E–450–M5—1983.

Archer S. Taylor: *The Transmission Media for data*—The IEEE Journal on Selected Areas in Communications, vol. SAC–3, No. 2, Mar. 1985.

Eldering et al.: *CATV Return Path characterization for Reliable Communications,* IEEE Communications Magazine, Aug. 1995.

Stephen B. Weinstein: *Getting the Picture, A Guide to CATV and the New Electronic Media,* 1986.

Rouzbeh Yassini, LANcity Corporation: *Using Cable TV's Hybrid Fiber Coax (HFC) Infrastructure for Data communications,* 44th Annual NCTA Convention and Exposition, Dallas, Texas, May 7–10, 1995.

James O. Farmer, Antec corporation: *Managing the Return Spectrum to Optimize Interactive Revenue Opportunities*— 44th Annual NCTA convention and Exposition, Dallas, Texas, May 7–10, 1995.

(List continued on next page.)

*Primary Examiner*—Paul Gensler
*Attorney, Agent, or Firm*—Pennie & Edmonds LLP

[57] ABSTRACT

This invention discloses a balancing circuit for providing a substantially fixed level of attenuation within a given return path frequency passband, while preventing noise related harmonics from distorting signal transmissions within the return path frequency passband. The balancing circuit includes coupling capacitors which are connected in series between input and output end nodes. A series connected inductor and capacitor pair is connected between each of the input and output end nodes and ground to form end sections. Another inductor is connected between the coupling capacitors and ground. A resistor is connected in parallel with the respective capacitor of each end section. The balancing circuit is placed in series at each subscriber port, and may be mounted on a printed circuit board and enclosed within a tubular housing with mating male and female "F" connections.

12 Claims, 6 Drawing Sheets

U.S. PATENT DOCUMENTS

| | | | |
|---|---|---|---|
| 2,245,722 | 6/1941 | Rust | 333/28 R |
| 2,974,188 | 3/1961 | Diambra . | |
| 2,988,713 | 6/1961 | Fukata | 333/28 R |
| 3,566,046 | 2/1971 | McCormick | 179/170 |
| 3,593,209 | 7/1971 | Gittinger | 333/11 |
| 3,806,813 | 4/1974 | Eller | 325/308 |
| 3,983,486 | 9/1976 | Rheinfelder | 325/308 |
| 4,077,006 | 2/1978 | Nicholson | 325/308 |
| 4,317,216 | 2/1982 | Kaegegein | 455/16 |
| 4,397,037 | 8/1983 | Theriault | 455/188 |
| 4,451,803 | 5/1984 | Holdsworth et al. | 333/12 |
| 4,488,126 | 12/1984 | Suthers | 333/18 |
| 4,633,202 | 12/1986 | Basile et al. | 333/109 |
| 4,901,043 | 2/1990 | Palinkas | 333/176 |
| 4,963,966 | 10/1990 | Harney et al. | 358/349 |
| 4,982,440 | 1/1991 | Dufresne et al. | 455/4 |
| 5,022,078 | 6/1991 | Zelenz | 380/7 |
| 5,058,198 | 10/1991 | Rocci et al. | 455/3 |
| 5,072,200 | 12/1991 | Ranky | 333/167 |
| 5,126,840 | 6/1992 | Dufresne et al. | 358/86 |
| 5,130,664 | 7/1992 | Pavlic et al. | 330/55 |
| 5,148,133 | 9/1992 | Zennamo, Jr. et al. | 333/175 |
| 5,157,362 | 10/1992 | Zelenz | 333/175 |
| 5,168,251 | 12/1992 | Zennammo, Jr. et al. | 333/175 |
| 5,214,505 | 5/1993 | Rabowsky et al. | 358/86 |
| 5,278,525 | 1/1994 | Palinkas | 333/175 |
| 5,343,158 | 8/1994 | Gris et al. | 328/103 |
| 5,361,394 | 11/1994 | Shigihara | 455/5.1 |
| 5,379,141 | 1/1995 | Thompson et al. | 359/125 |
| 5,390,337 | 2/1995 | Jelinek et al. | 455/5.1 |
| 5,404,161 | 4/1995 | Dougalss et al. | 348/1 |
| 5,425,027 | 6/1995 | Baran | 370/69.1 |
| 5,434,610 | 7/1995 | Loveless | 348/6 |
| 5,481,389 | 1/1996 | Pidgeon et al. | 359/161 |
| 5,485,630 | 1/1996 | Lee et al. | 455/4.1 |
| 5,488,413 | 1/1996 | Elder et al. | 348/13 |
| 5,537,680 | 7/1996 | Bruno | 455/15 |
| 5,548,255 | 8/1996 | Spielman | 333/132 |
| 5,719,792 | 2/1998 | Bush | 364/574 |
| 5,742,713 | 4/1998 | Sanders et al. | 385/24 |
| 5,745,838 | 4/1998 | Tresness et al. | 455/3.1 |
| 5,835,844 | 11/1998 | Stoneback et al. | 455/5.1 |
| 5,881,362 | 3/1999 | Eldering et al. | 455/2 |

FOREIGN PATENT DOCUMENTS

| | | | |
|---|---|---|---|
| 54-6820 | 1/1979 | Japan . | |
| 59-215185 | 12/1984 | Japan . | |
| 60-665530 | 4/1985 | Japan . | |
| 63-309084 | 12/1988 | Japan . | |
| 2-21789 | 1/1990 | Japan . | |
| 2-86383 | 3/1990 | Japan . | |
| 3-38105 | 2/1991 | Japan | 333/168 |
| 3-160883 | 7/1991 | Japan . | |
| 5-168014 | 7/1993 | Japan . | |
| 6-86284 | 3/1994 | Japan . | |
| 2 255 698 | 11/1992 | United Kingdom . | |
| 0 549 129 A1 | 6/1993 | United Kingdom . | |
| WO 89/10663 | 11/1989 | WIPO . | |

OTHER PUBLICATIONS

Dean A. Stoneback and William F. Beck: *Designing the Return System for Full Digital Services*—General Instument Communications, 1995.

Brian Johanson, Bob Chamberlin, Aravanan Gurusami: *HFC Return System: Management of Subscriber Induced Noise*—1996 Conference on Emerging Technologies, San Francisco, CA, Jan. 8–10, 1996.

K/M Type High Pass Filters.

Arcom SA Step Attenuator.

6,031,432

BALANCING APPARATUS FOR SIGNAL TRANSMISSIONS

Provisional Appln of 60/038,541, filed Feb. 28, 1997.

FIELD OF THE INVENTION

The field of this invention relates to return path transmissions. More specifically it relates to circuitry and apparatus for balancing return path transmissions in coaxial cables.

BACKGROUND

CATV services have historically delivered audio and video signals within a forward direction environment. That is, signals have been transmitted from the CATV operations center to the subscriber exclusively. However, now that CATV operators are allowed to offer services like internet access, telephony, and other interactive services to subscribers, it is necessary to have transmissions flow in the reverse direction for two way communication between the subscriber and the CATV operations center. This reverse direction is commonly called the "return path".

Most CATV operators have elected to use a 5 to 40 MHz frequency range for the reverse transmissions. Since the return path of 75-ohm coaxial cable systems has largely been ignored up to the present date, signal level inequalities within the cable system architecture creates integrity problems within a given return path spectrum. Thus, a means to balance signal levels is required in order to improve the transmission integrity of return path signals.

An article entitled "Designing the Return System for Full Digital Services", written by Dean A. Stoneback and William F. Beck discusses problems associated with signal level inequality in return path transmissions, and proposes methods for designing and setting up a return path system. This article is expressly incorporated by reference. However, there remains a need for simple circuitry which balances signal levels within a given return path spectrum, while also filtering signals below the return path spectrum to prevent noise related harmonics from disrupting signals within the return path spectrum.

SUMMARY OF THE INVENTION

It is a broad object of the invention to provide circuitry which balances signal levels within a given frequency range, while also filtering signals below a given frequency range. More particularly, the invention includes circuitry which balances signal levels within a given return path frequency range, while also filtering signals below a given return path frequency range. Preferably, the invention includes a balancing circuit that is placed in series at each subscriber port so as to provide for return path signal levels that are balanced within the CATV system architecture. The circuitry may be mounted on a printed circuit board and enclosed within a tubular housing with mating male and female "F" connections.

The balancing circuitry of the present invention is a modified version of a K/M high pass filter with "M" derived sections. The balancing circuitry includes coupling capacitors which are connected in series between input end and output end nodes. A series connected inductor and capacitor are connected between each of the input and output end nodes and ground to form end sections. Another inductor is connected between the coupling capacitors and ground. A resistor is placed in parallel with the respective capacitor of each end section.

By connecting a resistor in parallel with the capacitor of each section, the Quality Factor or "Q" of each capacitor is purposely reduced to a certain value. Since the Q factor of the capacitor of each section is reduced, the resonance of each section can be transformed to provide a substantially fixed level of attenuation within a particular passband frequency range.

In addition to providing a substantially fixed level of attenuation within a given frequency range, the circuitry also provides filtering below a given passband frequency to prevent noise related harmonics from disrupting transmissions within a given frequency passband.

In the preferred embodiment, the circuitry provides a substantially fixed level of attenuation within the 5–40 MHz frequency range since most cable operators have elected to use this frequency range for transmissions within the return path. Also, in the preferred embodiment, the invention provides for filtering below 5 MHz to prevent noise related harmonics from disrupting transmissions within the return path frequency range.

DETAILED DESCRIPTION OF THE PREFERRED EMBODIMENT

In the description which follows, any reference to either direction or orientation is intended primarily and solely for purposes of illustration and is not intended in any way as a limitation to the scope of the present invention. Also, the particular embodiments described herein, although being preferred, are not to be considered as limiting of the present invention.

Figure 1:
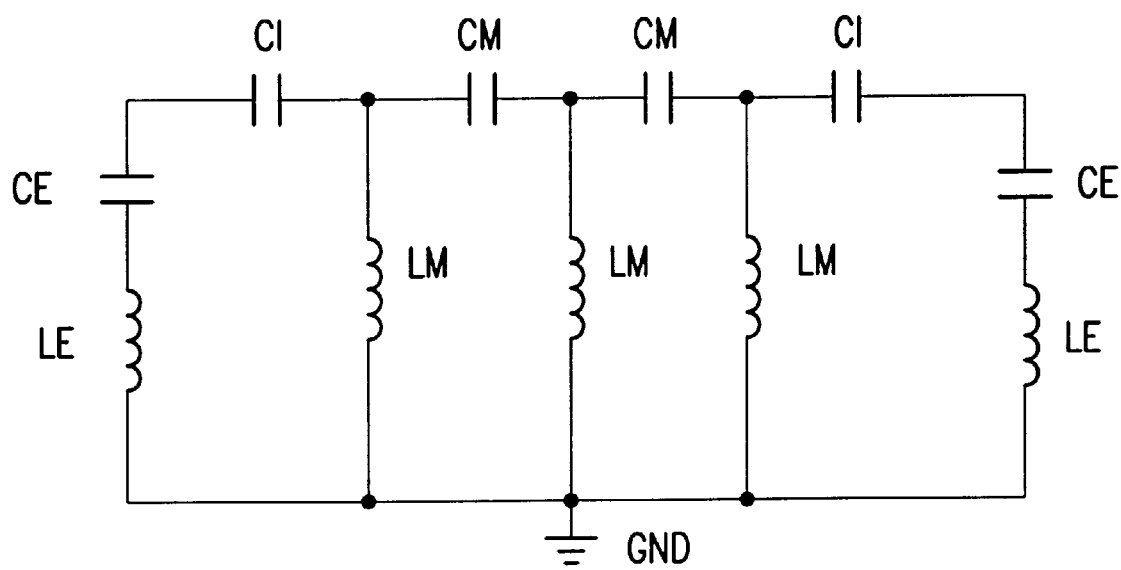
FIG. 1 shows a K/M high pass filter circuit.
Figure 2:
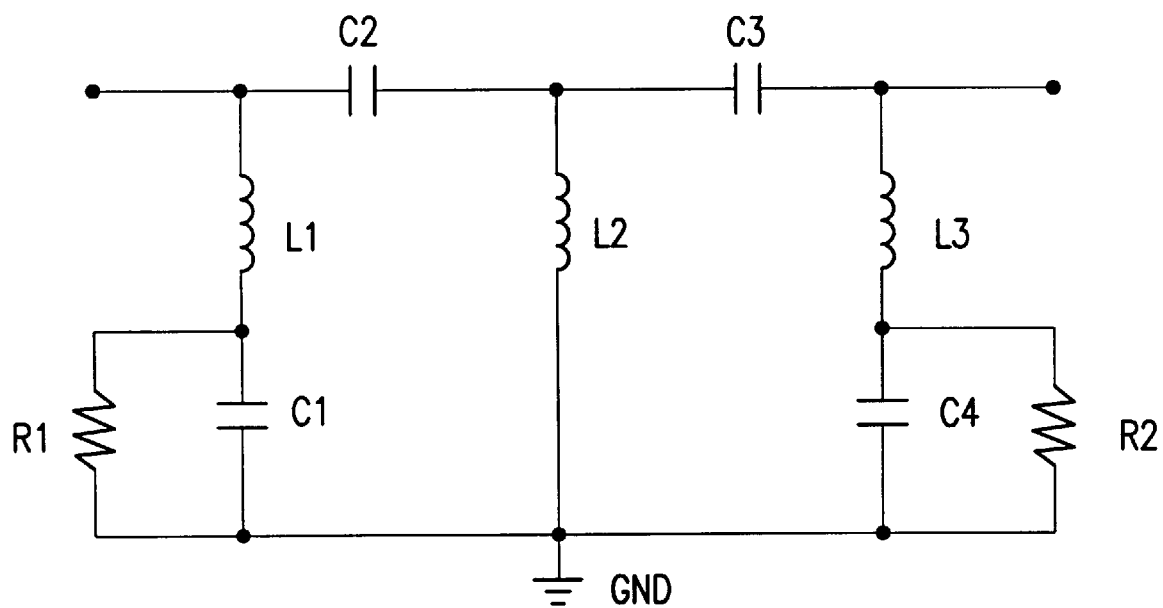
FIG. 2 shows a return path balancing circuit in accordance with the preferred embodiment of the present invention.

FIG. 1 shows a circuit diagram of a K/M high pass filter with M-derived end sections. The balancing circuit of the present invention is a modified version of a K/M high pass filter. FIG. 2 shows a circuit diagram of the preferred embodiment of the balancing circuit. Referring to FIG. 2, coupling capacitors C2 and C3 are connected in series between input and output end nodes of the balancing circuit. More particularly, capacitor C2 has a first terminal coupled to the input node and a second terminal. A first terminal of capacitor C3 is coupled to the second terminal of capacitor C2 and the second terminal of capacitor C3 is coupled to the output node.

An inductor L1 and a capacitor C1 are connected in series between the input node and ground GND. More particularly, inductor L1 has a first terminal coupled to the first terminal of capacitor C2 and a second terminal. Capacitor C1 has a first terminal coupled to the second terminal of inductor L1 and a second terminal coupled to ground GND. An inductor L2 has a first terminal coupled to the second terminal of capacitor C2 and a second terminal coupled to ground GND.

Inductor L3 and capacitor C4 are connected in series between the output node and ground GND. More particularly, inductor L3 has a first terminal coupled to the second terminal of capacitor C3 and a second terminal. Capacitor C4 has a first terminal coupled to the second terminal of inductor L3 and a second terminal coupled to ground GND.

Resistors R1 and R2 are respectively coupled in parallel with capacitors C1 and C4. More particularly, resistor R1 has a first terminal coupled to the first terminal of capacitor C1 and a second terminal coupled to ground GND. Resistor R2 has a first terminal coupled to the first terminal of capacitor C4 and a second terminal coupled to ground GND.

By connecting a resistor in parallel with the respective capacitor of each end section, the Quality Factor or "Q" of each capacitor is purposely reduced to a certain value. Q, of course, is a ratio of reactance to resistance. Since the Q factor of the capacitor of each end section is reduced, the resonance of each section can be transformed to provide a substantially fixed level of attenuation within a particular frequency range. That is, by reducing the "Q" of each section, attenuation levels within the high passband are substantially equalized.

In addition to providing a fixed level of attenuation within a given return path frequency band, the circuitry also provides filtering below the given frequency band to further enhance the integrity of the return path frequency band. Inductor L2 is preferably selected such that the balancing circuitry provides a steep level of attenuation below a given return path frequency band. In this manner, noise related harmonics are prevented from disrupting the transmission of signals within the return path frequency band. However, the balancing circuit of the present invention need not include a middle inductor such as L2.

Figure 3:
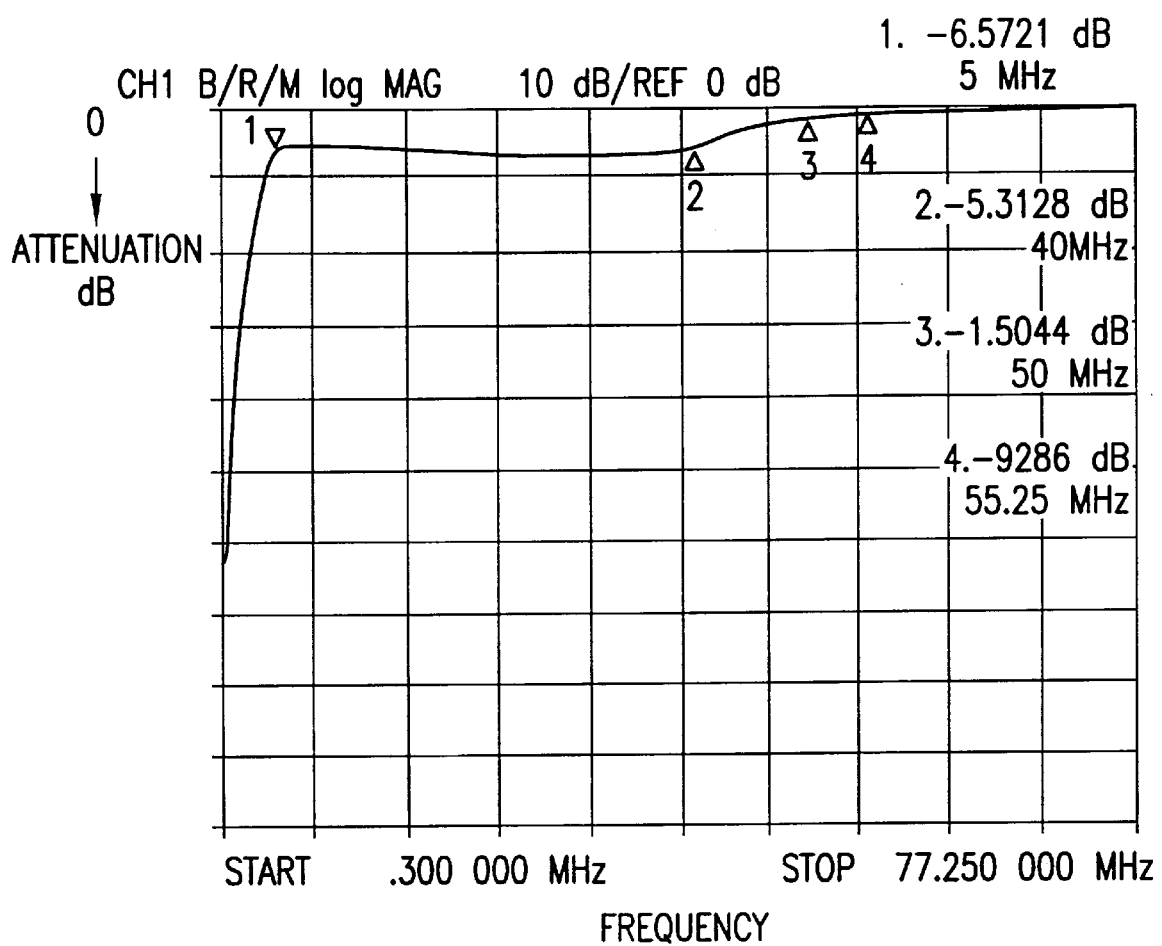
FIG. 3 shows the frequency response for the balancing circuit of FIG. 2 according to the preferred embodiment of the present invention.

The frequency response of the balancing circuitry of the preferred embodiment is illustrated in FIG. 3. In this preferred embodiment, component values are selected so as to provide a substantially fixed level of attenuation between a return path transmission frequency range of 5–40 MHz. This frequency range is presently the preferred industry standard for return path transmissions. As is illustrated in FIG. 3, the preferred embodiment of the invention provides steep attenuation of signals below 5 MHz, while providing a substantially fixed level of attenuation within a return path frequency range of 5–40 MHz. As shown in FIG. 3, the attenuation levels are substantially fixed at approximately 5–6 Db within the 5–40 MHz range. Those of ordinary skill, however, will recognize that values of the circuitry components could be selected such that the balancing circuitry of the present invention provides a substantially fixed level of attenuation in frequency ranges other than the preferred 5–40 MHz frequency range.

The approximate values for the components comprising the balancing circuit of the preferred embodiment of FIG. 2 for providing a substantially fixed level of attenuation within the preferred 5–40 MHz range are as follows: C1=30 pF with a "Q" of 2000; C2=120 pF with a "Q" of 2000; C3=390 pF with a "Q" of 2000; C4=43 pF with a "Q" of 2000; L1=560 nH with a "Q" of 50; L2=2200 nH with a "Q" of 50; L3=820 nH with a "Q" of 50; R1=510 ohms; and R2=180 ohms.

Figure 4:
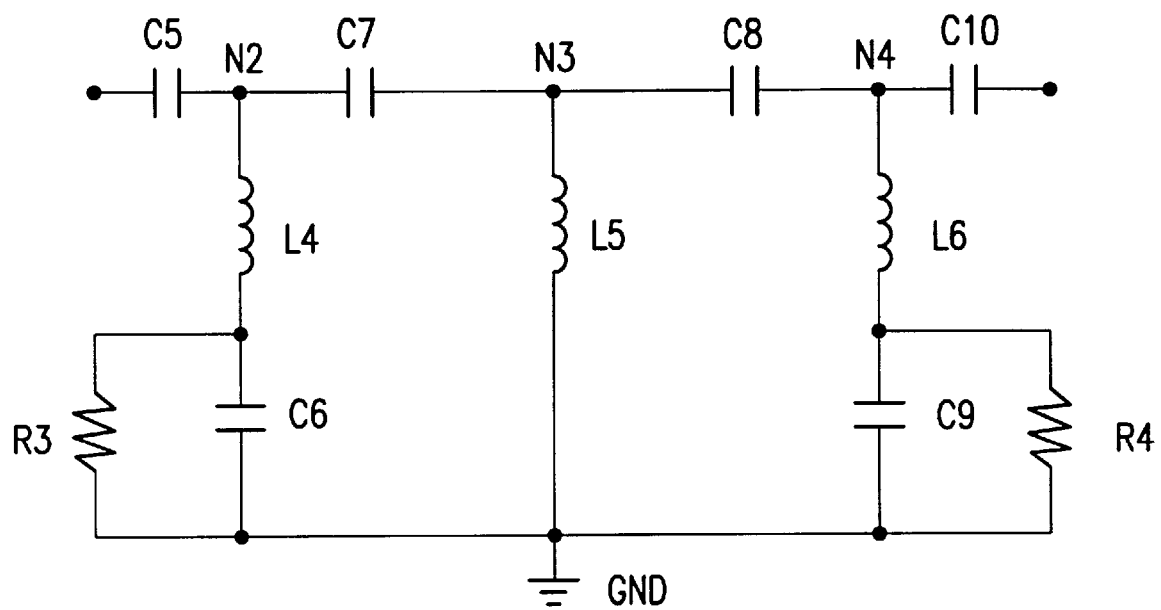
FIG. 4 shows a return path balancing circuit in accordance with another embodiment of the present invention.

FIG. 4 shows a circuit diagram of another embodiment of the present invention. Referring to FIG. 4, coupling capacitors C5, C7, C8, and C10 are connected in series between input and output end nodes of the balancing circuit. More particularly capacitor C5 has a first terminal coupled to the input node and a second terminal. Capacitor C7 has a first terminal coupled to the second terminal of capacitor C5 and a second terminal. Capacitor C8 has a first terminal coupled to the second terminal of capacitor C7 and a second terminal. Capacitor C10 has a first terminal coupled to the second terminal of capacitor C8 and a second terminal coupled to the output node.

An inductor L4 and a capacitor C6 are connected in series between node N2 and ground GND. More particularly, inductor L4 has a first terminal coupled to the second terminal of capacitor C5 and a second terminal. Capacitor C6 has a first terminal coupled to the second terminal of inductor L4 and a second terminal coupled to ground GND. Further, an inductor L5 has a first terminal coupled to the second terminal of C7 and a second terminal coupled to ground GND.

Inductor L6 and capacitor C9 are connected in series between node N3 and common ground. More particularly, inductor L6 has a first terminal coupled to the second terminal of capacitor C8 and a second terminal. Capacitor C9 has a first terminal coupled to the second terminal of inductor L6 and a second terminal coupled to ground GND.

Resistors R3 and R4 are respectively connected in parallel with capacitors C6 and C9. More particularly, resistor R3 has a first terminal coupled to the first terminal of capacitor C6 and a second terminal coupled to ground. Resistor R4 has a first terminal coupled to the first terminal of capacitor C9 and a second terminal coupled to ground.

As illustrated in FIG. 4, this balancing circuit is similar to the balancing circuit of FIG. 2 but includes end capacitors C5 and C10. The addition of capacitors C5 and C10 results in a response characteristic which slightly varies from that of the balance circuit of the preferred embodiment shown in FIG. 2.

The approximate values for the components comprising the balancing circuit of FIG. 4 for providing a substantially fixed level of attenuation within a preferred frequency range of 5–40 MHz are as follows: C5=820 pF with a "Q" of 2000; C6=27 pF with a "Q" of 2000; C7=130 pF with a "Q" of 2000; C8=470 pF with a "Q" of 2000; C9=39 pF with a "Q" of 2000; C10=750 pF with a "Q" of 2000; L4=620 nH with a "Q" of 50; L5=2700 nH with a "Q" of 50; L6=820 nH with a "Q" of 50; R3=620 ohms; and R4=220 ohms.

Figure 6:
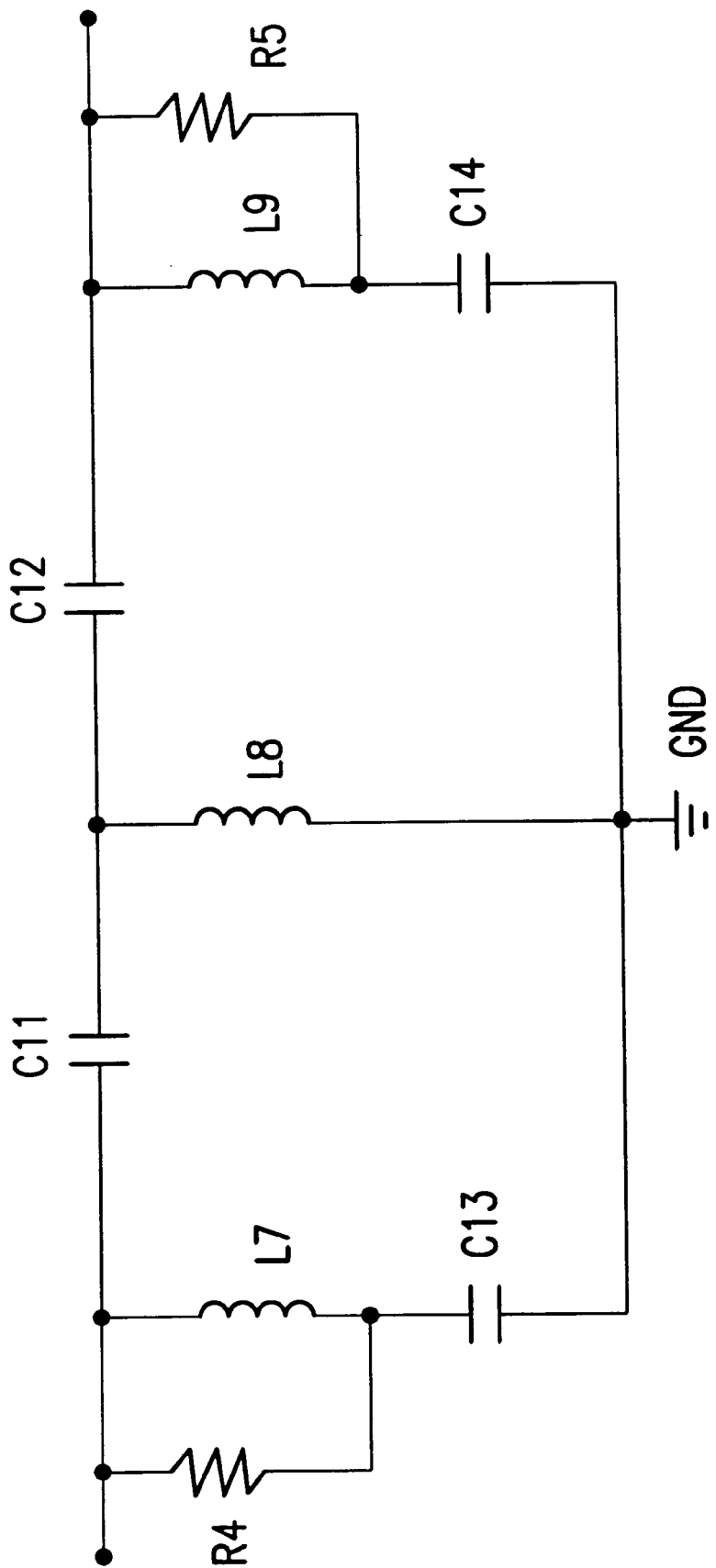
FIG. 6 shows a balancing circuit of yet another embodiment of the present invention.

In a less preferred embodiment, a resistor is connected in parallel with the inductor of each end section as shown in FIG. 6. The Q factor of the inductor of each end section would thus be reduced to a certain value. Since the Q factor of the inductor of each end section is reduced, the resonance of each section is transformed to provide a substantially fixed level of attenuation within a particular frequency range.

Figure 5:
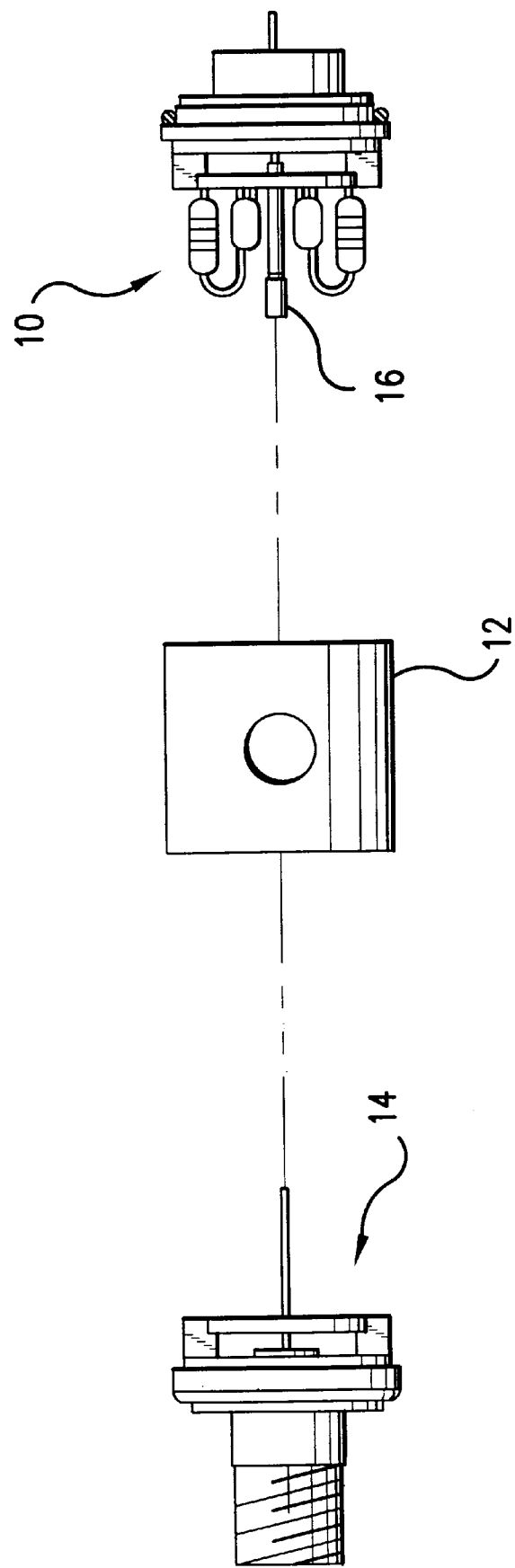
FIG. 5 shows a balancing circuit mounted on a circuit board for enclosure within a tubular housing with mating Male & Female connections.

The balancing circuitry of the present invention is preferably placed in series at each subscriber port so as to provide for return path signal levels that are balanced within the CATV system architecture. The circuitry 10 is mounted on a printed circuit board and enclosed within a tubular housing 12 with mating Male 14 and Female 16 "F" connections as illustrated in FIG. 5.

While the present invention has been described and illustrated herein with respect to a preferred embodiment thereof, it should be apparent that various modifications, adaptions, and variations may be made utilizing the teachings of the present disclosure without departing from the scope of the present invention and are intended to be within the scope of the present invention. For example, a balancing circuit could implement several middle stages of inductors as is shown in FIG. 1 without departing from the spirit and scope of the invention. The present invention also encompasses optical counter parts.

What is claimed is:

1. A balancing circuit for balancing return path transmissions in a coaxial cable communication system comprising:
   a plurality of series coupled capacitors coupled between respective input and output ends;
   a first inductor having a first terminal coupled to said input end, and having a second terminal;
   a first capacitor having a first terminal coupled to the second terminal of said first inductor, and having a second terminal coupled to ground;
   a second inductor having a first terminal coupled to said output end, and having a second terminal;
   a second capacitor having a first terminal coupled to the second terminal of said second inductor, and having a second terminal coupled to ground;
   a first resistor having a first terminal coupled to the first terminal of said first capacitor, and having a second terminal coupled to ground; and
   a second resistor having a first terminal coupled to the first terminal of said second capacitor, and having a second terminal coupled to ground, wherein the balancing circuit substantially equalizes signal attenuation levels within a given return path frequency range.

2. The balancing circuit of claim 1 further comprising a third inductor having a first terminal coupled between a node common to two of the plurality of series coupled capacitors and a second terminal coupled to ground.

3. The balancing circuit of claim 1 comprising at least four said series coupled capacitors, and wherein said first inductor has a first terminal coupled to a node between two of said series coupled capacitors, and wherein said second inductor has a first terminal coupled to a node between the remaining two capacitors of said at least four series coupled capacitors.

4. A balancing circuit for balancing return path transmissions in a coaxial cable communication system, comprising:
   a plurality of series coupled capacitors coupled between respective input and output ends;
   a first inductor having a first terminal coupled to said input end, and having a second terminal;
   a first capacitor having a first terminal coupled to the second terminal of said first inductor, and having a second terminal;
   a second inductor having a first terminal coupled to said output end, and having a second terminal;
   a second capacitor having a first terminal coupled to the second terminal of said second inductor, and having a second terminal coupled to the second terminal of said first capacitor;
   a first resistor having a first terminal coupled to the first terminal of said first capacitor, and having a second terminal coupled to the second terminal of said first capacitor; and
   a second resistor having a first terminal coupled to the first terminal of said second capacitor, and having a second terminal coupled to the second terminal of said second capacitor, wherein the balancing circuit substantially equalizes signal attenuation levels within a given return path frequency range.

5. In a coaxial cable communication system, a method of substantially equalizing signal attenuation levels within a given return path frequency range comprising the steps of:
   providing an input end, an output end, and a ground;
   providing a plurality of series coupled capacitors coupled between said input and output ends;
   providing a first capacitor and inductor pair coupled in series between said input end and ground;
   providing a second capacitor and inductor pair coupled in series between said output end and ground; and
   providing a resistor coupled in parallel with the capacitor of each of said first and second capacitors and inductor pairs so as to reduce a quality factor "Q" of the capacitor of each of said first and second capacitor and inductor pairs such that the balancing circuit provides signals at the output end with substantially fixed levels of attenuation within the given return path frequency range.

6. The method of claim 5, comprising the further step of providing an inductor coupled between a node between said input and output ends and ground such that noise related harmonics are prevented from distorting signals within the given frequency range.

7. A balancing circuit comprising:
   an input end;
   an output end;
   a ground;
   means respectively coupled between the input and output ends and ground for substantially equalizing signal attenuation levels within a given return path frequency range; and
   means coupled between a node between said input and output ends and ground for filtering signals below said given return path frequency range.

8. A balancing circuit comprising:
   a plurality of series coupled capacitors coupled between respective input and output ends;
   a first inductor having a first terminal coupled to said input end, and having a second terminal;
   a first capacitor having a first terminal coupled to the second terminal of said first inductor, and having a second terminal coupled to ground;
   a second inductor having a first terminal coupled to said output end, and having a second terminal;
   a second capacitor having a first terminal coupled to the second terminal of said second inductor, and having a second terminal coupled to ground;
   a first resistor having a first terminal coupled to the first terminal of said first capacitor, and having a second terminal coupled to ground;
   a second resistor having a first terminal coupled to the first terminal of said second conductor, and having a second terminal coupled to ground; and
   a third inductor having a first terminal coupled between a node common to two of the plurality of series coupled capacitors and a second terminal coupled to ground.

9. A balancing circuit comprising:
   a plurality of series coupled capacitors coupled between respective input and output ends;
   a first inductor having a first terminal coupled to said input end, and having a second terminal;
   a first capacitor having a first terminal coupled to the second terminal of said first inductor, and having a second terminal coupled to ground;
   a second inductor having a first terminal coupled to said output end, and having a second terminal;
   a second capacitor having a first terminal coupled to the second terminal of said second inductor, and having a second terminal coupled to ground;

a first resistor having a first terminal coupled to the first terminal of said first capacitor, and having a second terminal coupled to ground;

a second resistor having a first terminal coupled to the first terminal of said second capacitor, and having a second terminal coupled to ground; wherein there are at least four said series coupled capacitors, and wherein said first inductor has a first terminal coupled to a node between two of said series coupled capacitors, and wherein said second inductor has a first terminal coupled to a node between the remaining two capacitors of said at least four series coupled capacitors.

10. A method of substantially equalizing signal attenuation levels within a given frequency range comprising the steps of:

providing an input end, an output end, and a ground;

providing a plurality of series coupled capacitors coupled between said input and output ends;

providing a first capacitor and inductor pair coupled in series between said input end and ground;

providing a second capacitor and inductor pair coupled in series between said output end and ground;

providing a resistor coupled in parallel with the capacitor of each of said first and second capacitors and inductor pairs so as to reduce a quality factor "Q" of the capacitor of each of said first and second capacitor and inductor pairs; and providing an inductor coupled between a node between said input and output ends and ground such that noise related harmonics are prevented from distorting signals within the given frequency range.

11. A balancing circuit for balancing return path transmissions in a coaxial cable communication system comprising:

a plurality of series coupled capacitors coupled between respective input and output ends;

a first inductor having a first terminal coupled to said input end, and having a second terminal;

a first capacitor having a first terminal coupled to the second terminal of said first inductor, and having a second terminal coupled to ground;

a second inductor having a first terminal coupled to said output end, and having a second terminal;

a second capacitor having a first terminal coupled to the second terminal of said second inductor, and having a second terminal coupled to ground;

a first resistor having a first terminal coupled to the first terminal of said first inductor, and having a second terminal coupled to the second terminal of said first inductor; and a second resistor having a first terminal coupled to the first terminal of said second inductor, and having a second terminal coupled to the second terminal of said second inductor, wherein the balancing circuit substantially equalizes signal attenuation levels within a given return path frequency range.

12. The balancing circuit of claim 11 further comprising a third inductor having a first terminal coupled between a node common to two of the plurality of series coupled capacitors and a second terminal coupled to ground.

* * * * *